United States Patent

Ishibashi

[11] Patent Number: 5,605,610
[45] Date of Patent: Feb. 25, 1997

[54] METHOD OF FABRICATING TRANSPARENT CONDUCTIVE ITO FILMS

[75] Inventor: Keizi Ishibashi, Fuchu, Japan

[73] Assignee: Anelva Corporation, Fuchu, Japan

[21] Appl. No.: 532,937

[22] Filed: Sep. 22, 1995

[30] Foreign Application Priority Data

Dec. 17, 1994 [JP] Japan .................................. 6-334267

[51] Int. Cl.$^6$ ..................................................... C23C 14/35
[52] U.S. Cl. ......................................................... 204/192.29
[58] Field of Search .............................. 204/192.29, 192.3

[56] References Cited

U.S. PATENT DOCUMENTS 4,124,474  11/1978  Bomchil et al. ................... 204/192.13

FOREIGN PATENT DOCUMENTS 2-47255  2/1990  Japan ................................. 204/192.29

OTHER PUBLICATIONS

M. Buchanan et al, *Thin Solid Films*, vol. 80, pp. 373–382 (Jun. 1981).

*Primary Examiner*—Aaron Weisstuch
*Attorney, Agent, or Firm*—Burns, Doane, Swecker & Mathis, LLP

[57] ABSTRACT

A film having a low resistivity until the end of a sputtering target life is obtained when fabricating transparent conductive ITO films on a number of or a single substrate continuously by magnetron sputtering. A method of fabricating by magnetron sputtering transparent conductive ITO films having In and O as basic constituent elements and added Sn as a donor in an atmosphere comprising an inert gas and $O_2$ is provided in which a sintered mixture of oxides of In and Sn is used as a target. This method includes a first step of performing film deposition, and a second step of performing, after the first step is stopped, electric discharge at a power density at which the rate at which the target is eroded is faster than the formation rate of the superficial oxygen-deficient layer of the target in order to remove the superficial oxygen-deficient layer of the target formed in the first step. The first and second steps are alternately repeated.

27 Claims, 2 Drawing Sheets

METHOD OF FABRICATING TRANSPARENT CONDUCTIVE ITO FILMS

BACKGROUND OF THE INVENTION

1. Field of the Invention

The present invention relates to a method of fabricating transparent conductive ITO films and, more particularly, to a method of fabricating transparent conductive ITO films used for electrodes of a liquid-crystal display or a solar cell by sputtering.

2. Description of the Related Art

As a transparent conductive film, a transparent conductive ITO film having In (indium) and O (oxygen) as basic constituent elements and having Sn (tin) added thereto as a donor has hitherto been known. This transparent conductive ITO film is fabricated by a chemical film formation process utilizing a chemical reaction, such as a spray process, a CVD process, a wet dipping process, or a physical film formation process utilizing a physical phenomenon in a vacuum such as a vacuum deposition process, or a sputtering process.

Of the above-described thin-film fabricating methods, the sputtering process is superior to the other film formation methods in that a transparent conductive ITO film having a relatively low resistivity can be obtained, and a transparent conductive ITO film having a uniform thickness can be formed on a relatively large substrate such as a glass plate.

For the sputtering process, a direct current (DC) discharge sputtering method and a radio frequency (RF) discharge sputtering method are available. At present, the direct current (DC) discharge method (called a DC sputtering process) is conventionally used among the sputtering processes because of its low cost, stable discharges, and easy control. For the sputtering process, a magnetron sputtering method is also available in which a plasma is converged on a surface of a target with a closed magnetic field produced by one or more magnets disposed behind the target. The magnetron sputtering method is also conventionally used among the sputtering processes because of its high-film deposition rate and therefore the magnetron sputtering method is available for mass production of integrated circuits. Based on the above, as a method of fabricating transparent conductive ITO films in mass production, a DC magnetron sputtering process in which a direct current discharge method and a magnetron method are combined is generally used at present. The DC magnetron sputtering process has recently been developed into a movable magnet mode in which the magnets disposed behind the target are reciprocated (oscillated) or eccentrically rotated to sputter the entire surface of the target.

In the sputtering process, in general, as main factors which exert an influence upon the resistivity of a transparent conductive ITO film, substrate temperature and an oxygen partial pressure are known. When the substrate temperature is increased, the resistivity of the film is decreased. When the oxygen partial pressure is decreased, a number of oxygen vacancies are produced within the film fabricated in that atmosphere. A film having a number of oxygen vacancies has a high carrier density, but, in contrast, the mobility of carriers is low. On the other hand, in the film fabricated in an atmosphere having a high oxygen partial pressure, the number of oxygen vacancies is small, and therefore the carrier density is low, but the mobility of carriers is high. Since the resistivity is proportional to the inverse of the product of the carrier density and the mobility of the carriers, there is a most appropriate oxygen partial pressure at which the resistivity becomes a minimum due to balance between the carrier density and the carrier mobility. Therefore, in the conventional sputtering process, the resistivity of a transparent conductive ITO film is decreased by adjusting each of the substrate temperature and the oxygen partial pressure as parameters.

In the fabrication of transparent conductive ITO films by using the above-described DC magnetron sputtering process, the deposition rate is usually approximately 100 nm/min. This deposition rate is affected by various factors, such as the spacing between the target and the substrate, and the density of the target (or the filling density). However, the deposition rate is mainly determined by the power applied to the target. In the case of an ordinary stationary magnet mode, the power to be applied to the target is about 1 to 2 W/cm$^2$, determined by dividing the power to be applied to the target by the eroded area of the target. In the case of a movable magnet mode (oscillating motion or eccentric rotation), the power to be applied to the target is about 1 to 2 W/cm$^2$, as determined represented by dividing the power to be applied to the target by the eroded area of the target formed when the magnet used in the movable magnet mode remains stationary.

The density of the target (the filling density) means the ratio of the actual target density to the theoretical density calculated from the crystalline structure of an oxide of indium (In$_2$O$_3$). The value represented by dividing the power to be applied to the target by the eroded area of the target is called "power density". In the case of a movable magnet mode, the value represented by dividing the power to be applied to the target by the eroded area of the target formed when the movable magnet remains stationary is called "power density".

When transparent conductive ITO films are continuously fabricated by DC magnetron sputtering at a power density of about 1 to 2 W/cm$^2$ described above, the resistivity value of the transparent conductive ITO film is increased gradually with an increase in the number of times of the fabrication of the films (or the number of films deposited). Therefore, the resistivities of all the obtained transparent conductive ITO films are not the same. Consequently, there arises a problem that the resistivities of the transparent conductive ITO films, which are continuously fabricated by a DC magnetron sputtering process, increase as sputtering proceeds.

FIG. 3 shows a change in the resistivity of a film with respect to the cumulative power applied to a target when transparent conductive ITO films are continuously fabricated on a glass substrate by a DC magnetron sputtering process with the power density being set at 1.0 and 2.0 W/cm$^2$. Here, the cumulative power means the number of times of the fabrication or the number of films deposited in the continuous fabrication of transparent conductive ITO films. The continuous fabrication of transparent conductive ITO films is performed in a single substrate processing mode in which a film is deposited on each substrate by one sputtering process by using a sintered target (density: 95%) having 10 wt. % of SnO$_2$ added to In$_2$O$_3$ at a substrate temperature set at 200° C. and at a pressure of sputter gas of 0.4 Pa. The sputter gas is a mixture of Ar and O$_2$ gases, and the concentration of the O$_2$ gas in the sputter gas is adjusted in such a manner that the resistivity becomes a minimum every 3 kWh of the cumulative power. It can be seen from FIG. 3 that the resistivity at the power density of 2.0 W/cm$^2$ is smaller in the rate of the increase than at 1.0 W/cm$^2$. However, the resistivity increases as the cumulative power increases for both of the power densities.

As shown in the above-described example, when the films are continuously fabricated by a magnetron sputtering process at a power density of about 1 to 2 W/cm², the resistivities of all the transparent conductive ITO films fabricated are not in a desirable range. Conventionally, by mechanically shaving off the surface of the target before reaching the end of the target life, resistivity is kept within a predetermined range required to guarantee the performance of a device, such as a liquid-crystal display or a solar cell. Such redundant operations during the continuous fabrication cause problems, for example, a low productivity, or a high manufacturing cost.

FIG. 3 shows that the resistivity of the film increases as the cumulative power increases when transparent conductive ITO films are continuously fabricated. Such an increase of resistivity of the film with respect to the cumulative power, strictly speaking, occurs during film deposition on one substrate. That is, the resistivity of the film on one substrate increases along the thickness of the film. Therefore, in the case of depositing a film, to some extent a thick film, there arises a problem that the resistivity of the film, as a whole, increases as the film thickness increases.

It is an object of the present invention to solve the above-described problems. It is another object of the present invention to provide a method of fabricating transparent conductive ITO films having a low resistivity within a predetermined range until the end of the target life while continuously fabricating transparent conductive ITO films by magnetron sputtering. It is a further object of the present invention to provide a method of fabricating transparent conductive ITO films having a predetermined low resistivity even if the film thickness is great, while fabricating a transparent conductive ITO film on a single substrate.

It is a still further object of the present invention to provide a method of fabricating transparent conductive ITO films having a low resistivity from a view point of controlling the power density to be applied to the target. It is a still further object of the present invention to provide a method of fabricating transparent conductive ITO films capable of enhancing the efficiency of the target utilization and, as a result, enhancing the productivity of transparent conductive ITO films.

In accordance with a first aspect of the present invention, in a method of fabricating transparent conductive ITO films by a magnetron sputtering process, a sintered mixture of oxides of In and Sn being used as a target, the transparent conductive ITO film having In and O as basic constituent elements and added Sn as a donor, the method comprising a first step of depositing a transparent conductive ITO film on a substrate in an atmosphere produced by an inert gas and an oxygen gas, and a second step of removing, after the first step is stopped, a superficial oxygen-deficient layer of the target formed during the first step by means of electric discharge at a power density at which the rate at which the target is eroded is faster than the formation rate of the superficial oxygen-deficient layer, the first and second steps being alternately repeated.

In accordance with a second aspect of the present invention, the above-described power density is determined according to the density of the target in the first aspect of the present invention.

In accordance with a third aspect of the present invention, when the density of the target is 95% the power density is 2.5 W/cm² or more in the second aspect of the present invention.

In accordance with a fourth aspect of the present invention, when the density of the target is 70%, the power density is 4 W/cm² or more in the second aspect of the present invention.

In accordance with a fifth aspect of the present invention, the target is cooled by cooling means in the first aspect of the present invention.

In accordance with a sixth aspect of the present invention, in the first aspect of the present invention, when the resistivity of the transparent conductive ITO film has reached the limit of the resistivity required to guarantee the performance of the device in which the transparent conductive ITO film is used, the first step shifts to the second step, the second step is terminated after the superficial oxygen-deficient layer of the target is removed, the first step is started again, thereafter the first and second steps are alternately repeated in the same procedure.

In accordance with a seventh aspect of the present invention, a transparent conductive ITO film is continuously formed on each of a plurality of substrates in the first step, and thereafter a second step is performed in each of the above-described aspects of the present invention.

In accordance with an eighth aspect of the present invention, the first and second steps are alternately repeated on one substrate in each of the above-described aspects of the present invention.

In accordance with a ninth aspect of the present invention, a mixture of oxides of In and Sn is used as a target, a transparent conductive ITO film having In and O as basic constituent elements and added. Sn as a donor deposited in an atmosphere produced by an inert gas and an oxygen gas by a magnetron sputtering process, film deposition takes place at a power density at which a rate at which the target is eroded faster than the rate of formation of the superficial oxygen-deficient layer.

In accordance with a tenth aspect of the present invention, the power density is determined according to the density of the target in the ninth aspect of the present invention.

In accordance with an eleventh aspect of the present invention, when the density of the target is about 95%, the power density is from 2.5 W/cm² to less than 4 W/cm² in the tenth aspect of the present invention.

In accordance with a twelfth aspect of the present invention, when the density of the target is about 70%, the power density is 4 W/cm² or more in the tenth aspect of the present invention.

In accordance with a thirteenth aspect of the present invention, the target is cooled by cooling means in each of the above-described ninth to twelfth aspects of the present invention.

In the present invention, the rate relation condition that the rate at which the target is eroded is faster than the formation rate of a superficial oxygen-deficient layer is satisfied by controlling the power density. The superficial oxygen-deficient layer formed on the surface of the target is removed by the control of the power density according to the rate relation condition. The control of the power density makes it possible to prevent the oxygen concentration of the target superficial layer from decreasing as the fabrication of the transparent conductive ITO film proceeds. Therefore, the control of the power density makes it possible to prevent an increase of the resistivity of the film caused by the formation of the superficial oxygen-deficient layer of the target. Consequently, the control of the power density makes it possible to maintain the resistivity of the film fabricated by DC magnetron sputtering within a relatively low predetermined range even if (a) transparent conductive ITO films are continuously fabricated on each of a plurality of substrates, or (b) a transparent conductive ITO film having a fairly great thickness is fabricated on a single substrate. Furthermore, since the film may be fabricated efficiently up to the end of the target life by removing the superficial layer of the target, the control of the power density enhances the efficiency of the target utilization. In addition, since the superficial layer of the target is removed, redundant operations, such as mechanically shaving off the surface of the target, or replacing the target, are not necessary. Thus, the control of the power density leads to improved productivity of transparent conductive ITO films.

With the power density being set at a value which satisfies the above-described rate relation condition, transparent conductive ITO films can be continuously fabricated on each of a plurality of substrates by DC magnetron sputtering. However, in the continuous fabrication of transparent conductive ITO films, it is possible to include a second step in which magnetron sputtering is performed at a power density which satisfies the above-described rate relation condition when the resistivity of the transparent conductive ITO film has reached an upper limit of resistivity required to guarantee the performance of a device in which the transparent conductive ITO film is used during the first step in which film deposition is performed at a power density which is most appropriate for film deposition. Furthermore, it is possible to alternately perform the first and second steps in the continuous fabrication of transparent conductive ITO films. In such continuous fabrication also, the superficial oxygen-deficient layer of the target formed during the continuous fabrication is removed in the second step. The removal of the superficial oxygen-deficient layer in the second step makes it possible to restore the surface of the target to the same state as its initial use in the next first step. Therefore, in the second step, the resistivity of the film which has increased gradually during the continuous fabrication is returned to the value obtainable in the initial use of the target.

The above and further objects, aspects and novel features of the invention will more fully appear from the following detailed description when read in connection with the accompanying drawings. It is to be expressly understood, however, that the drawings are for the purpose of illustration only and are not intended to limit the invention.

DESCRIPTION OF THE PREFERRED
EMBODIMENTS

Preferred embodiments of the present invention will be described below with reference to the accompanying drawings.

First, the basis on which a method of fabricating a transparent conductive ITO film is conceived in accordance with the present invention will be described.

For example, the DC magnetron sputtering process has the problem that resistivity increases as sputtering proceeds in the case where transparent conductive ITO films are continuously deposited on a plurality of substrates in a single substrate processing mode in which film deposition is performed on a single substrate by one sputtering process. This problem arises because the concentration of oxygen gradually decreases in the superficial layer of the target as the continuous sputtering proceeds. The gradual decrease of the concentration of oxygen in the superficial layer of the target results from the oxygen being released from the superficial layer of the target because of a rise in the surface temperature of the target due to ion bombardment during sputtering or because of oxygen-selective sputtering. Such a phenomenon produces a superficial oxygen-deficient layer. Further, because oxygen present inside the target diffuses into the superficial oxygen-deficient layer, this superficial oxygen-deficient layer spreads deep into the target as the sputtering proceeds.

The oxygen flux sputtered from the surface of the target contains an atomic oxygen flux. The atomic oxygen flux is more active than the molecular oxygen flux which is included in the sputter gas. The active atomic oxygen flux easily reacts with the surface of the growing ITO film, and further tends to accumulate at the lattice site of oxygen on the surface of the ITO film. Therefore, the atomic oxygen flux contributes to improving crystallinity of the film in comparison with molecular oxygen. The improved crystallinity film shows a low resistivity. Therefore, the greater the atomic oxygen flux sputtered from the target, the lower the resistivity of the film becomes. However, if there is a superficial oxygen-deficient layer in the target, the sputtered atomic oxygen flux is reduced.

Figure 3:
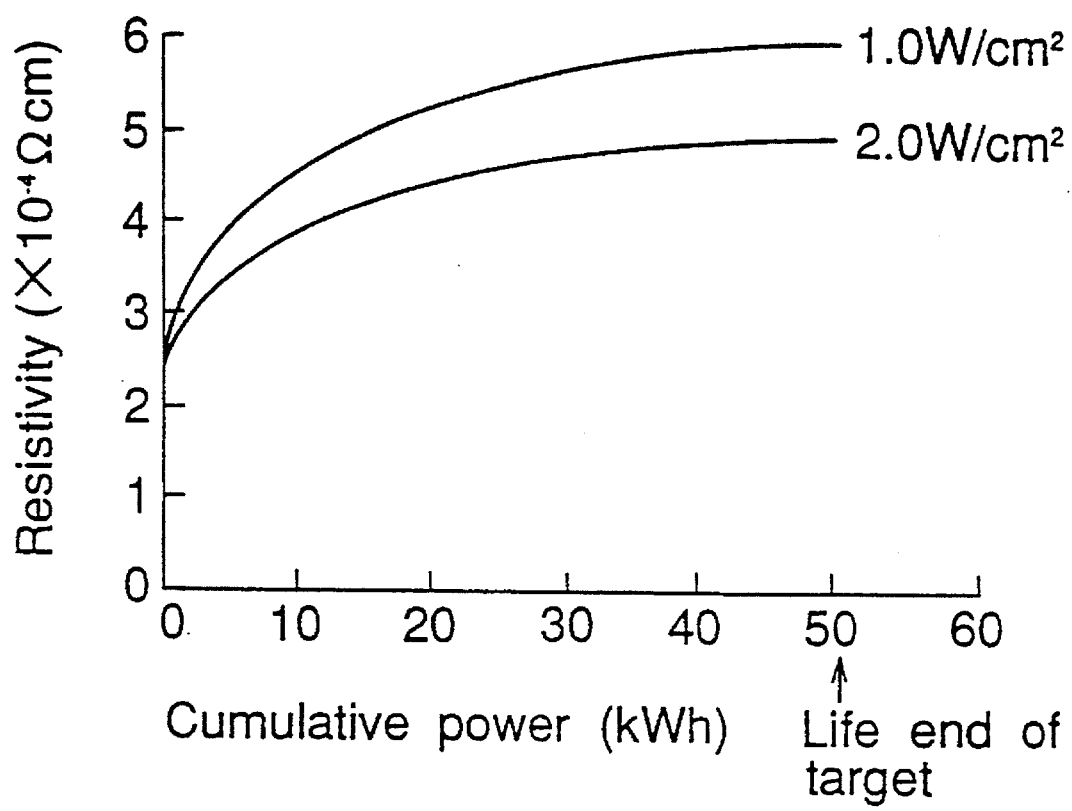
FIG. 3 is a graph showing a change in the resistivity of the transparent conductive ITO film with respect to the cumulative power, where the film is manufactured in accordance with a conventional method.

In the of FIG. 3, film deposition is performed in such a way that the amount of $O_2$ gas introduced is adjusted so that the resistivity of the film becomes a minimum every constant increment (3 kWh) of the cumulative power (integrated power). As shown in FIG. 3, in spite of the adjustment of the amount of $O_2$ gas introduced, the resistivity of the film increases as the cumulative power increases in both cases where the power density is 1.0 W/cm$^2$ and 2.0 W/cm$^2$. When film deposition is performed by such continuous sputtering, the adjustment of only the amount of $O_2$ gases introduced makes it impossible to return the resistivity of the film to the minimum value obtainable in the initial use of the target. This is due to the fact that, as described above, the atomic oxygen flux to be sputtered from the target is decreased because of the deficiency of oxygen in the target, i.e., the superficial oxygen-deficient layer.

In the conventional continuous fabrication by a sputtering process, as described above, an appropriate amount (usually several %) of $O_2$ gas is included in the sputter gas so that resistivity can become a minimum every constant increment of cumulative power. A part of the $O_2$ gas included in the sputter gas contributes to the oxidation of the surface of the target, and thus oxygen must have been compensated for the surface of the target. However, the conventional sputtering process, the introduction of an appropriate amount of $O_2$ gas cannot check an increase in the resistivity of the film with an increase of the cumulative power, as shown in FIG. 3. This is attributed to the fact that, for such an amount of introduction of $O_2$ gas, oxygen is released faster by oxygen-selective sputtering or by a rise in the surface temperature than the target is oxidized due to the oxygen molecules introduced. As a result, oxygen becomes deficient in the superficial layer of the target, and an oxygen-deficient layer is formed.

In the present invention, based on the above-described fact, the resistivity of a transparent conductive ITO film fabricated on a substrate is prevented from increasing by removing a superficial oxygen-deficient layer formed in the target or preventing the formation thereof. The removal or prevention of formation of the superficial oxygen-deficient layer is realized by setting the power density of sputtering discharge in such a way that the rate at which the target is eroded is faster than the formation rate of the oxygen-deficient layer at the surface of the target.

Figure 1:
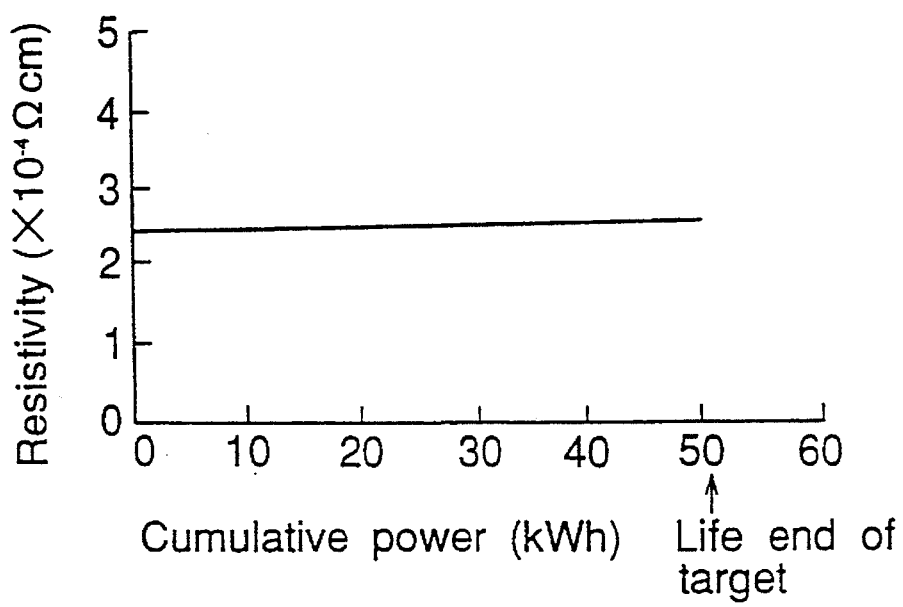
FIG. 1 is a graph showing a change in the resistivity of a transparent conductive ITO film with respect to the cumulative power, where the film is manufactured in accordance with a method of a first embodiment of the present invention.

A first embodiment of the present invention will now be described. This first embodiment shows a basic concept of the present invention. FIG. 1 is the graph showing a change in the resistivity of a film with respect to the power applied to a target in the first embodiment.

In the first embodiment, transparent conductive ITO films are fabricated continuously by a DC magnetron sputtering process of a stationary magnet mode according to a single wafer processing mode. A target of a sintered mixture (density: 95%) having 10 wt. % of $SnO_2$ added to $In_2O_3$ is used, a power density of 2.5 W/cm$^2$ is applied to the target, a transparent conductive ITO film is formed on a glass substrate heated to 200° C. by a heating device at a pressure 0.4 Pa of sputter gas, which is a mixture of Ar and $O_2$ gases. Throughout the continuous fabrication, the $O_2$ gas in the sputter gas is maintained at a concentration of 4%, at which the resistivity becomes a minimum in the initial period of the sputtering.

As can be seen from the graph of FIG. 1, the resistivity is nearly constant up to the end of the target life even if the cumulative power increases. That is, it is possible to obtain a transparent conductive ITO film having nearly the same resistivity even if films are deposited on a number of substrates in the continuous fabrication of transparent conductive ITO films by sputtering.

The numerical values of the various conditions in the above-described steps are only examples, and are not limited to these numerical values.

According to this embodiment, it is possible to fabricate transparent conductive ITO films having nearly the same low resistivity on a substrate by using a target of a sintered mixture with a density of 95% and by setting the density of power applied to the target at 2.5 W/cm$^2$. It may be said that the power density at which the condition of "the rate at which the target is erosion by sputtering is faster than the formation rate of the oxygen-deficient layer" is satisfied is 2.5 W/cm$^2$.

When the power density applied to the target is 2.5 W/cm$^2$, the formation rate of the superficial oxygen-deficient layer of the target is estimated to be not more than 20 nm/sec in the target having a density of 95%. On the other hand, when the power density applied to the target is 2.5 W/cm$^2$, the erosion rate at which the target having a density of 95% is eroded is about 20 nm/sec. Therefore, if the power density is set to be 2.5 W/cm$^2$ or more for the target having a density of 95% of this embodiment, the rate at which the target is eroded is faster than the formation rate of the superficial oxygen-deficient layer of the target during sputtering. Sputtering in which the power density is set at 2.5 W/cm$^2$ or more for the target having a density of 95% makes it possible to prevent the resistivity of the transparent conductive ITO film from increasing, as shown in FIG. 1, in the continuous fabrication of transparent conductive ITO films.

In a case where the density of the target is about 95%, the power density is 2.5 W/cm$^2$ or more, and the other film deposition conditions shown in the first embodiment are satisfied, it is possible to fabricate a transparent conductive ITO film having nearly the same resistivity on a substrate while removing an oxygen-deficient layer formed on the surface of the target. However, if the power density is 4 W/cm$^2$ or more, the target becomes likely to be broken due to the thermal expansion difference between the heated sputtering surface of the target and the cooled rear surface of the target. It is preferable that the power density be set at 2.5 W/cm$^2$ to less than 4 W/cm$^2$ in order to prevent this breakage.

A target having a density of less than 95% (hereinafter referred to as a "low-density target") has a thermal conductivity lower than that of the target having a density of 95% (hereinafter referred to as a "high-density target"). Since the low thermal conductivity causes the temperature of the surface of the target to rise further, the low thermal conductivity causes the rate at which oxygen is released from the surface of the target to increase. That is, the low thermal conductivity causes the rate at which the superficial oxygen-deficient layer of the target is formed to increase. Therefore, to make the etch rate by sputtering faster than the formation rate of the superficial oxygen-deficient layer, it is necessary to increase the power density in the low-density target to more than in the high-density target. For example, in the case of a low-density target having a density of 70%, the power density is required to be 4 W/cm$^2$ or more. However, the low-density target having a density of 70% will not be broken even if a power density of 4 W/cm$^2$ or more is applied to the low-density target since a great number of pores or gaps present inside the low-density target in comparison with a high-density target relax the thermal expansion difference with the rear surface of the target. In fact, when a power density of 4 W/cm$^2$ is applied to the low-density target having a density of 70%, the target is not broken up to the end of the target life, and a transparent conductive ITO film having nearly the same resistivity can be obtained.

As described above, the power density at which the condition of "the rate at which the target is eroded is faster than the formation rate of the oxygen-deficient layer" is satisfied depends upon the target density. In general, the power density increases with a decrease in the target density. In this way, the power density determined according to the target density so that the above-described rate relation is satisfied makes it possible to continuously fabricate transparent conductive ITO films having nearly the same low resistivity.

When the power density is increased to make the rate at which the target is eroded faster than the formation rate of the oxygen-deficient layer, the amount of heat supplied to the target increases. An increase in this amount of heat causes the temperature of the surface of the target to rise and therefore the diffusion rate (i.e., the formation rate of the oxygen-deficient layer) of oxygen to increase. The target is required to be sufficiently cooled to check the rise in the temperature of the surface of the target. To cool the target, it is preferable that a cooling device be disposed behind the target.

According to a method of fabricating transparent conductive ITO films in accordance with a second embodiment, (1) a first step of depositing transparent conductive ITO films on a glass substrate continuously in a single wafer processing mode by DC magnetron sputtering is performed at a power density of 1.5 W/cm$^2$, (2) when the resistivity of the transparent conductive ITO film manufactured on the substrate has reached $3.7 \times 10^{-4}$ $\Omega$cm, the first step shifts to a second step of removing the oxygen-deficient layer formed during the first step, (3) in the second step, DC magnetron discharge is performed for 30 minutes at a power density of 4.5 W/cm$^2$, and the first and second steps are alternately performed with shift timing according to the above-described step (2) until the end of the target life. In this embodiment, according to a DC magnetron sputtering process with a stationary magnet mode, film deposition is performed on a glass substrate heated to 200° C. by using a target made of a sintered mixture (density: 95%) having 10 wt. % of $SnO_2$ added to $In_2O_3$ at a pressure 0.4 Pa of a mixed gas of Ar and $O_2$ gases serving as a sputter gas. Up to the end of the target life, the $O_2$ gas in the sputter gas is kept at a constant concentration of 2%, at which the resistivity has become a minimum in the initial period of the sputtering.

Figure 2:
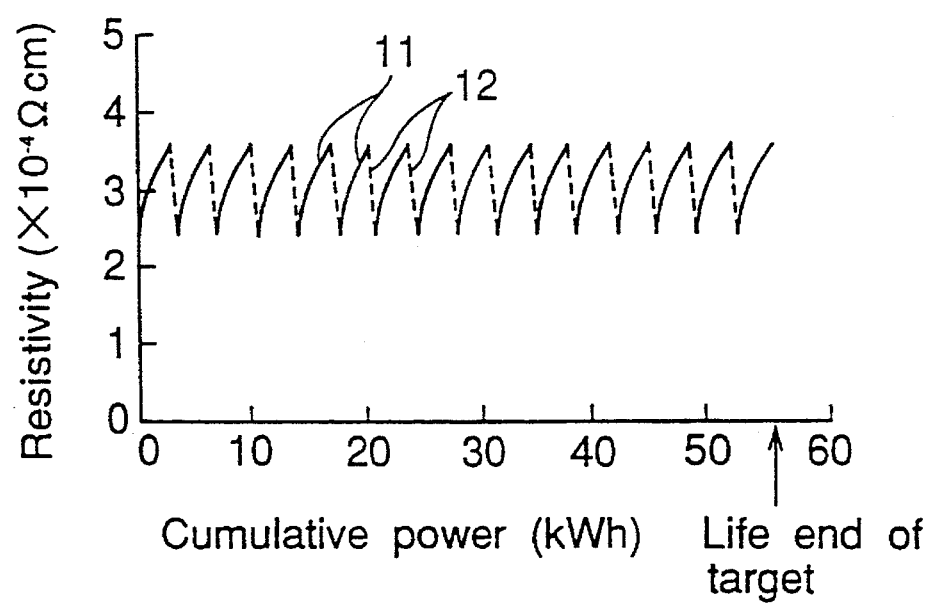
FIG. 2 is a graph showing a change in the resistivity of the transparent conductive ITO film with respect to the cumulative power, where the film is manufactured in accordance with a method of a second embodiment of the present invention.

FIG. 2 is a graph showing a change in the resistivity of the film with respect to the cumulative power in the second embodiment. The solid line 11 in FIG. 2 indicates a change in the resistivity of the film in the first step. The dotted line 12 in FIG. 2 indicates a return of the increased resistivity during the first step to its initial value after the second step is performed.

The numerical values of the various conditions for film deposition, such as power density, resistivity, or discharge time, in the above-described steps are only examples, and are not limited to these numerical values. The fabrication method of the second embodiment may be applicable to a case in which transparent conductive ITO films are continuously fabricated in a batch processing mode in which these films are deposited on a plurality of substrates.

According to the second embodiment, as shown in FIG. 2, the superficial oxygen-deficient layer of the target formed during the first step is eroded during the second step in which DC magnetron discharge is performed for 30 minutes at a power density of 4.5 W/cm$^2$. In the second step, the resistivity of the film which has increased to $3.7 \times 10^{-4}$ $\Omega$cm is returned to $2.4 \times 10^{-4}$ $\Omega$cm, which is nearly the same as in the initial period. In the case where the first and second steps are repeatedly alternately performed in this manner, the resistivity of the transparent conductive ITO films continuously fabricated until the end of the target life is in the range of $2.4 \times 10^{-4}$ to $3.7 \times 10^{-4}$ $\Omega$cm.

In the second embodiment, the resistivity is returned to its initial value in the second step performed for 30 minutes at a power density of 4.5 W/cm$^2$. However, the power density in the second step may preferably be such that the rate at which the target is eroded is faster than the formation rate of the oxygen-deficient layer on the surface of the target. In the case of a target with a density of about 95%, the power density in the second step may preferably be 2.5 W/cm$^2$ or more, as shown in the first embodiment. However, the higher the power density in the second step becomes, the shorter the time required for the second step can be made.

If the resistivity of the film when the first step shifts to the second step is set to be small, since the oxygen-deficient layer formed during the first step is thin, the time required for the second step can be shortened.

Furthermore, if Ar gas is used as a sputter gas in the second step in place of a mixture of Ar and $O_2$ gases, since the rate at which the target is eroded becomes faster, the time required for the second step can be shortened even more.

In the second embodiment, the first step shifts to the second step when the resistivity of the film becomes $3.7 \times 10^{-4}$ $\Omega$cm. The shift timing by which resistivity of the film is determined may be set by any desired parameter. For example, the shift timing may be set at a time when the resistivity of the film reaches the upper limit of resistivity required to guarantee the performance of a device (a liquid-crystal display or a solar cell) in which the transparent conductive ITO film is used. In another example, the timing at which the first step shifts to the second step may be determined on the basis of the elapsed time of the first step. Incidentally, the time required for the resistivity of the film to increase up to $3.7 \times 10^{-4}$ $\Omega$cm in the first step in the second embodiment is about 10 hours. In the second embodiment, the first step may shift to the second step after 10 hours.

Although the above-described second embodiment describes a target having a high density of 95% as an example, when the density of the target is low, the power density in the second step in which the oxygen-deficient layer is etched must be increased more than that in this embodiment in the same manner as described in the first embodiment. For example, the power density must be 4 W/cm$^2$ or more for a target having a low density of 70%.

In a method of fabricating transparent conductive ITO films in accordance with a third embodiment, a first step of performing film deposition by sputtering and a second step of removing an oxygen-deficient layer on the surface of a target are repeatedly performed while a film is being deposited on a single substrate.

Conventionally, the resistivity of the film being manufactured increases along the thickness of the film. When the conventional example shown in FIG. 3 is taken into consideration, if the film to be manufactured is fairly thick, it can be easily estimated that the resistivity of the film increases along the thickness of the film from $2.4 \times 10^{-4}$ $\Omega$cm to $3.7 \times 10^{-4}$ $\Omega$cm, and further increases beyond that. A fairly thick film thus will have a high resistivity as a whole. In such a case, if a first step of performing film deposition by sputtering and a second step of removing an oxygen-deficient layer on the surface of the target are repeatedly performed, it is possible to check an increase in the resistivity even if the film thickness is increased fairly. The setting of the timing at which the first step shifts to the second step at a desired resistivity value makes it possible to manufacture a transparent conductive ITO film having a desired resistivity. As described above, a method of fabricating transparent conductive ITO films in accordance with the third embodiment is effective for a case in which a lower resistivity of the film or uniformity of the resistivity along the thickness of the film is desired.

Also in the movable magnet mode in which magnets disposed behind the target are oscillated or eccentrically rotated, the power density with respect to the rate relation between the erosion rate and the formation rate of the oxygen-deficient layer is essentially the same as for a stationary magnet mode. Even in the RF magnetron sputtering process, if a power density at which the above rate relation can be maintained is applied to the target, it is possible to check an increase in the resistivity of the transparent conductive ITO film formed on the substrate in the same way as in the DC magnetron sputtering process.

As is clear from the foregoing description, according to the present invention, the following advantageous effects are obtained.

According to the present invention, since film deposition is performed at a power density at which the rate at which the target is eroded is faster than the formation rate of the oxygen-deficient layer, the superficial oxygen-deficient layer of the target is not formed, and the concentration of oxygen in the target is not decreased. As a result, even if transparent conductive ITO films are continuously fabricated by a DC magnetron sputtering process, it is possible to check an increase in the resistivity as the sputtering proceeds. Thus, it is possible to obtain a transparent conductive ITO film having nearly the same low resistivity up to the end of the target life.

In the continuous fabrication of transparent conductive ITO films, by repeatedly performing a first step in which conventional film deposition takes place continuously at a power density most appropriate for film deposition, and a second step in which a superficial oxygen-deficient layer of a target formed during the first step is removed when the resistivity of the transparent conductive ITO film reaches a predetermined value, it is possible to check an increase in the resistivity as the sputtering proceeds. Also, by repeatedly alternately performing a first step in which film deposition is performed by sputtering, and a second step in which a superficial oxygen-deficient layer of a target is removed in a film being formed on a substrate, it is possible to check an increase in the resistivity along the thickness of the film. As a result, even if the film increases in thickness, it is possible to obtain a transparent conductive ITO film having a relatively low resistivity.

Many various embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded the broadest interpretation, so as to encompass all such modifications, equivalent structures and functions.

What is claimed is:

1. A method of fabricating transparent conductive ITO films having In and O as basic constituent elements and added Sn as a donor by a magnetron sputtering process in an atmosphere comprising an inert gas and oxygen, a mixture of oxides of In and Sn being used as a target, said method comprising a first step of forming said transparent conductive ITO film on a substrate magnetron sputtering, and a second step of performing, after the first step is stopped, electric discharge at a power density at which the rate at which the target is eroded is faster than the formation rate of a superficial oxygen-deficient layer of said target formed in said first step in order to remove the superficial oxygen-deficient layer, the first and second steps being alternately repeated.

2. A method of fabricating transparent conductive ITO films according to claim 1, wherein said power density is determined on the basis of the density of said target.

3. A method of fabricating transparent conductive ITO films according to claim 2, wherein when the density of said target is approximately 95%, said power density is 2.5 W/cm$^2$ or more.

4. A method of fabricating transparent conductive ITO films according to claim 3, wherein said transparent conductive ITO films are continuously formed on a plurality of substrates in said first step, and then said second step is performed.

5. A method of fabricating transparent conductive ITO films according to claim 3, wherein said transparent conductive ITO films are continuously formed on a plurality of substrates in said first step, and then said second step is performed.

6. A method of fabricating transparent conductive ITO films according to claim 3, wherein said first and second steps are alternately repeated to form an ITO film on a single substrate.

7. A method of fabricating transparent conductive ITO films according to claim 2, wherein when the density of said target is approximately 70%, said power density is 4 W/cm$^2$ or more.

8. A method of fabricating transparent conductive ITO films according to claim 7, wherein said transparent conductive ITO films are continuously formed on a plurality of substrates in said first step, and then said second step is performed.

9. A method of fabricating transparent conductive ITO films according to claim 7, wherein said first and second steps are alternately repeated to form an ITO film on a single substrate.

10. A method of fabricating transparent conductive ITO films according to claim 2, wherein said transparent conductive ITO films are continuously formed on a plurality of substrates in said first step, and then said second step is performed.

11. A method of fabricating transparent conductive ITO films according to claim 2, wherein said first and second steps are alternately repeated to form an ITO film on a single substrate.

12. A method of fabricating transparent conductive ITO films according to claim 1, wherein said target is cooled by cooling means.

13. A method of fabricating transparent conductive ITO films according to claim 12, wherein said transparent conductive ITO films are continuously formed on a plurality of substrates in said first step, and then said second step is performed.

14. A method of fabricating transparent conductive ITO films according to claim 12, wherein said first and second steps are alternately repeated to form an ITO film on a single substrate.

15. A method of fabricating transparent conductive ITO films according to claim 1, wherein when the resistivity of said transparent conductive ITO film has reached the limit of the resistivity required to guarantee the performance of a device comprising said ITO film, said first step is stopped, and the first step shifts to the second step where said superficial oxygen-deficient layer of said target is removed, after which said first step is started again, and thereafter said first and second steps are alternately repeated in the same manner.

16. A method of fabricating transparent conductive ITO films according to claim 15, wherein said transparent conductive ITO films are continuously formed on a plurality of substrates in said first step, and then said second step is performed.

17. A method of fabricating transparent conductive ITO films according to claim 15, wherein said first and second steps are alternately repeated to form an ITO film on a single substrate.

18. A method of fabricating transparent conductive ITO films according to claim 1, wherein said transparent conductive ITO films are continuously formed on a plurality of substrates in said first step, and then said second step is performed.

19. A method of fabricating transparent conductive ITO films according to claim 1, wherein said first and second steps are alternately repeated to form an ITO film on a single substrate.

20. A method of fabricating transparent conductive ITO films having In and O as basic constituent elements and added Sn as a donor by a magnetron sputtering process in an atmosphere comprising an inert gas and oxygen, a mixture of oxides of In and Sn being used as a target, said method comprising a step of depositing a film at a power density at which the rate at which the target is eroded is faster than the formation rate of an oxygen-deficient superficial layer of said target.

21. A method of fabricating transparent conductive ITO films according to claim 20, wherein said power density is determined on the basis of the density of said target.

22. A method of fabricating transparent conductive ITO films according to claim 21, wherein when the density of said target is approximately 95%, said power density is in a range of 2.5 W/cm$^2$ to less than 4 W/cm$^2$.

23. A method of fabricating transparent conductive ITO films according to claim 22, wherein said target is cooled by cooling means.

24. A method of fabricating transparent conductive ITO films according to claim 21, wherein when the density of said target is approximately 70%, said power density is 4 W/cm$^2$ or more.

25. A method of fabricating transparent conductive ITO films according to claim 24, wherein said target is cooled by cooling means.

26. A method of fabricating transparent conductive ITO films according to claim 21, wherein said target is cooled by cooling means.

27. A method of fabricating transparent conductive ITO films according to claim 20, wherein said target is cooled by cooling means.

* * * * *